(12) United States Patent
Nishimura et al.

(10) Patent No.: US 11,368,140 B2
(45) Date of Patent: Jun. 21, 2022

(54) RESONATOR AND RESONANCE DEVICE

(71) Applicant: Murata Manufacturing Co., Ltd., Nagaokakyo (JP)

(72) Inventors: Toshio Nishimura, Nagaokakyo (JP); Ville Kaajakari, Altadena, CA (US)

(73) Assignee: MURATA MANUFACTURING CO., LTD., Nagaokakyo (JP)

( * ) Notice: Subject to any disclaimer, the term of this patent is extended or adjusted under 35 U.S.C. 154(b) by 1153 days.

(21) Appl. No.: 15/904,906

(22) Filed: Feb. 26, 2018

(65) Prior Publication Data
US 2018/0191329 A1 Jul. 5, 2018

Related U.S. Application Data

(63) Continuation of application No. PCT/JP2016/068477, filed on Jun. 22, 2016.
(Continued)

(51) Int. Cl.
*H03H 9/24* (2006.01)
*H03H 9/10* (2006.01)
(Continued)

(52) U.S. Cl.
CPC ...... *H03H 9/2405* (2013.01); *H03H 9/02433* (2013.01); *H03H 9/0595* (2013.01);
(Continued)

(58) Field of Classification Search
CPC ............. H03H 9/2405; H03H 9/02433; H03H 9/0595; H03H 9/1035; H03H 9/1057; H03H 2009/0244
See application file for complete search history.

(56) References Cited

U.S. PATENT DOCUMENTS 4,350,918 A * 9/1982 Sato ..................... G04F 5/063
                                                310/320
5,548,180 A    8/1996 Kaida
(Continued)

FOREIGN PATENT DOCUMENTS

JP    2007-104431 A    4/2007
JP    2008-166903 A    7/2008
(Continued)

OTHER PUBLICATIONS

International Search Report issued for PCT/JP2016/068477, dated Sep. 13, 2016.
(Continued)

*Primary Examiner* — Jeffrey M Shin
(74) *Attorney, Agent, or Firm* — ArentFox Schiff LLP

(57) ABSTRACT

A resonator that includes a piezoelectric vibrating portion; a retainer provided in at least part of an area surrounding the piezoelectric vibrating portion; a first node generating portion disposed between the piezoelectric vibrating portion and the retainer; a first connecting arm that connects the first node generating portion to a region in the piezoelectric vibrating portion that faces the first node generating portion; and a first retaining arm that connects the first node generating portion to a region in the retainer that faces the first node generating portion. The first node generating portion is substantially symmetrical with respect to each of two lines passing through a center of the first node generating portion along a first direction and a second direction orthogonal to the first direction, with the first direction being a direction that the first connecting arm connects the first node generating portion to the piezoelectric vibrating portion.

20 Claims, 14 Drawing Sheets

Related U.S. Application Data

(60) Provisional application No. 62/221,308, filed on Sep. 21, 2015.

(51) Int. Cl.
*H03H 9/02* (2006.01)
*H03H 9/05* (2006.01)

(52) U.S. Cl.
CPC ........ *H03H 9/1035* (2013.01); *H03H 9/1057* (2013.01); *H03H 2009/0244* (2013.01)

(56) References Cited

U.S. PATENT DOCUMENTS

| | | | |
|---|---|---|---|
| 2010/0156566 A1* | 6/2010 | Abdolvand | H03H 9/2405 333/195 |
| 2010/0314969 A1* | 12/2010 | Gaidarzhy | H03H 9/02433 310/321 |
| 2018/0191329 A1 | 7/2018 | Nishimura et al. | |

FOREIGN PATENT DOCUMENTS

| | | |
|---|---|---|
| JP | 2010-232943 A | 10/2010 |
| JP | 6646899 B2 | 2/2020 |

OTHER PUBLICATIONS

Written Opinion of the International Searching Authority issued for PCT/JP2016/068477, dated Sep. 13, 2016.

* cited by examiner

RESONATOR AND RESONANCE DEVICE

CROSS REFERENCE TO RELATED APPLICATIONS

The present application is a continuation of PCT/JP2016/068477 filed Jun. 22, 2016, which claims priority to U.S. Provisional Patent Application No. 62/221,308, filed Sep. 21, 2015, the entire contents of each of which are incorporated herein by reference.

TECHNICAL FIELD

The present disclosure relates to a resonator and a resonance device in which a vibrating portion vibrates in an in-plane vibration mode.

BACKGROUND

Conventionally, resonance devices using a micro electro mechanical systems (MEMS) technique have been used as timing devices, for example. Such resonance devices are mounted on a printed circuit board included in an electronic device, such as a smartphone. The resonance device includes a lower-side substrate, an upper-side substrate that forms a cavity with the lower-side substrate, and a resonator disposed in the cavity between the lower-side substrate and the upper-side substrate.

For example, Patent Document 1 (identified below) discloses a resonator that can effectively excite a width expansion mode by selecting, in a vibrator having a rectangular cross-section, a ratio b/a between a length b of long sides of the rectangle and a length a of short sides of the rectangle such that the ratio b/a is within a specific range.

Patent Document 1: U.S. Pat. No. 5,548,180.

Moreover, conventional resonators use a configuration in which a rectangular vibrating portion (i.e., the vibrator) is connected by a retaining arm to a retainer. In these resonators, where the vibrating portion is retained by the retaining arm, vibration leaks and this causes anchor loss. As a result, the Q-factor of the resonator is degraded. In the resonator described in Patent Document 1, by optimizing the aspect ratio of the vibrator, nodal points are formed at center portions of sides of the vibrator parallel to the direction of vibration. However, no consideration has been given to the direction perpendicular to vibration and the direction of thickness of the vibrator. As such, anchor loss still occurs.

SUMMARY OF THE INVENTION

Accordingly, the resonator of the present disclosure has been made in view of the circumstances described above, and aims to improve the Q-factor by reducing the anchor loss in the resonator.

Thus, a resonator according to an exemplary aspect includes a piezoelectric vibrator; a retainer provided in at least part of an area surrounding the piezoelectric vibrating portion; a first node generating portion disposed between the piezoelectric vibrating portion and the retainer; a first connecting arm that connects the first node generating portion to a region in the piezoelectric vibrating portion that faces the first node generating portion; and a first retaining arm that connects the first node generating portion to a region in the retainer that faces the first node generating portion. The first node generating portion is substantially symmetrical with respect to each of two lines passing through a center of the first node generating portion along a first direction and a second direction orthogonal to the first direction, the first direction being a direction in which the first connecting arm connects the first node generating portion to the piezoelectric vibrating portion.

With the resonator described above, nodal points of vibration of the piezoelectric vibrating portion in the stacking direction can be generated on the node generating portion. Advantageously, this configuration reduces anchor loss produced when the vibrating portion is retained by the retainer, and makes it possible to improve the Q-factor.

The resonator preferably further includes a second node generating portion disposed between the piezoelectric vibrating portion and the retainer in such a manner as to face the first node generating portion, with the piezoelectric vibrating portion interposed therebetween. Moreover, a second connecting arm connects the piezoelectric vibrating portion to the second node generating portion; and a second retaining arm connects the second node generating portion to the retainer. The second node generating portion is preferably substantially symmetrical with respect to each of two lines passing through a center of the second node generating portion along the first direction and the second direction. In particular, the piezoelectric vibrating portion is preferably formed by stacking a first electrode, a piezoelectric thin film, and a second electrode. Moreover, the first node generating portion and the second node generating portion each preferably have a plurality of node regions where vibrational displacement of the piezoelectric vibrating portion in the stacking direction is smaller than in areas therearound. Furthermore, the first retaining arm preferably connects to the first node generating portion in any of the plurality of node regions in the first node generating portion; and the second retaining arm preferably connects to the second node generating portion in any of the plurality of node regions in the second node generating portion.

The first node generating portion and the second node generating portion are preferably substantially circular in shape. The first node generating portion and the second node generating portion are preferably in the shape of a rectangle with four sides of substantially equal length. A width of the first connecting arm and the second connecting arm is preferably larger than a width of the first retaining arm and the second retaining arm. The first retaining arm preferably does not lie on an extension of the first connecting arm along the first direction, and the second retaining arm preferably does not lie on an extension of the second connecting arm along the first direction.

The resonator preferably includes a plurality of first retaining arms and a plurality of second retaining arms, and the plurality of first retaining arms and the plurality of second retaining arms preferably connect to respective ones of the plurality of node regions. In this case, it is possible to further reduce anchor loss produced when the vibrating portion is retained by the retainer.

A resonance device according to another exemplary aspect includes any of the resonators described above.

With this resonance device, anchor loss is reduced and it is possible to improve the Q-factor.

Advantageously, with the resonator according to the exemplary embodiments disclosed herein, the Q-factor can be improved by reducing anchor loss.

DETAILED DESCRIPTION OF EMBODIMENTS

First Embodiment

Figure 1:
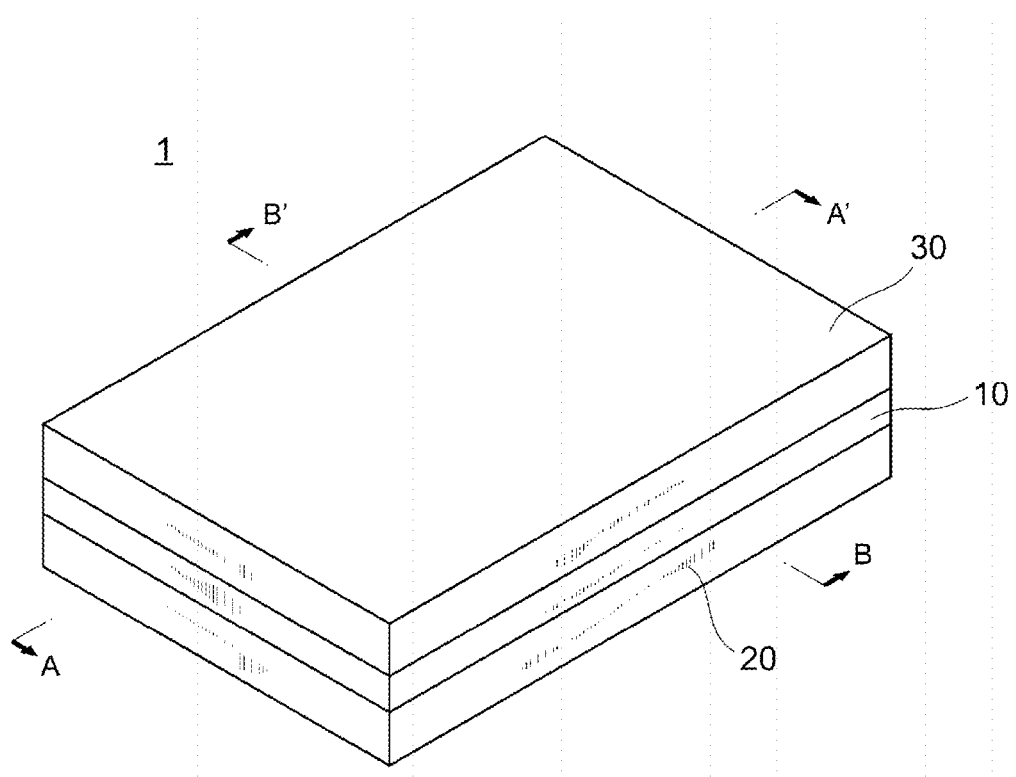
FIG. 1 is a perspective view schematically illustrating an appearance of a resonance device according to a first exemplary embodiment.
Figure 2:
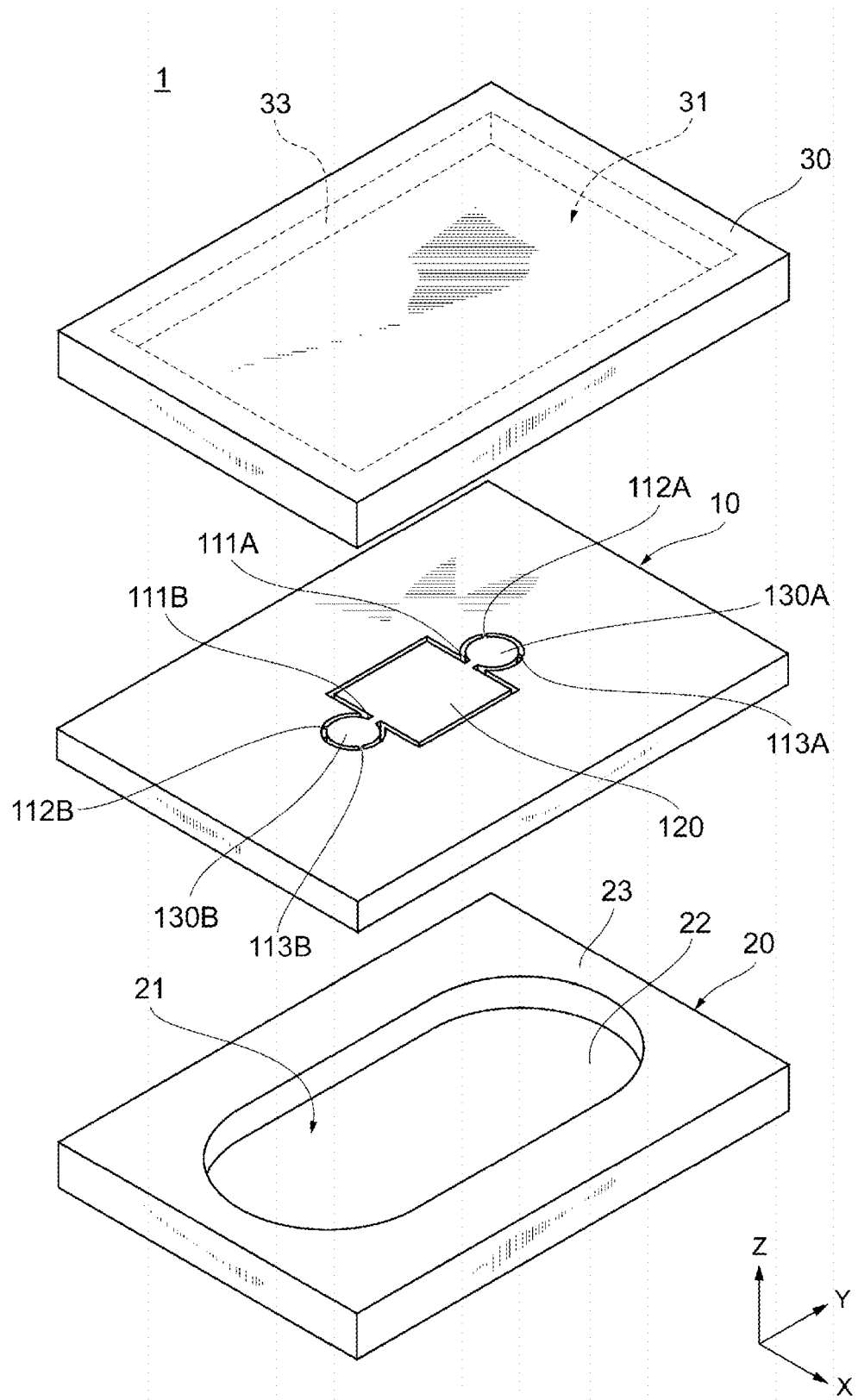
FIG. 2 is an exploded perspective view schematically illustrating a structure of the resonance device according to the first exemplary embodiment.

Hereinafter, a first exemplary embodiment will be described with reference to the attached drawings. FIG. 1 is a perspective view schematically illustrating an appearance of a resonance device 1 according to the first exemplary embodiment. FIG. 2 is an exploded perspective view schematically illustrating a structure of the resonance device 1 according to the first exemplary embodiment.

As generally shown, the resonance device 1 includes a resonator 10, and an upper cover 30 and a lower cover 20 provided with the resonator 10 interposed therebetween. That is, the resonance device 1 is formed by stacking the lower cover 20, the resonator 10, and the upper cover 30 in this order.

The resonator 10 is joined to the lower cover 20 and the upper cover 30. This seals the resonator 10 and forms a vibration space of the resonator 10. The resonator 10, the lower cover 20, and the upper cover 30 are each preferably formed using an Si substrate. The resonator 10, the lower cover 20, and the upper cover 30 are joined together by joining the Si substrates together. The resonator 10 and the lower cover 20 may be formed using an SOI substrate.

In the exemplary aspect, the resonator 10 is an MEMS resonator manufactured using the MEMS technique. The resonator 10 may be a crystal resonator.

Hereinafter, each component of the resonance device 1 will be described in detail.

(1. Upper Cover 30)

The upper cover 30 extends in a flat plate-like manner along the XY-plane, and a recessed portion 31 in the shape of, for example, a flat rectangular parallelepiped is formed on the back side of the upper cover 30. The recessed portion 31 is surrounded by a side wall 33, and forms part of the vibration space, which is a space where the resonator 10 vibrates.

(2. Lower Cover 20)

The lower cover 20 includes a rectangular flat bottom plate 22 disposed along the XY-plane, and a side wall 23 extending from the perimeter of the bottom plate 22 in the Z-axis direction (i.e., in the stacking direction of the lower cover 20 and the resonator 10). The lower cover 20 has, on the surface thereof facing the resonator 10, a recessed portion 21 (i.e., a "recess") formed by the front surface of the bottom plate 22 and the inner surface of the side wall 23. The recessed portion 21 forms part of the vibration space of the resonator 10. By the upper cover 30 and the lower cover 20 described above, the vibration space is hermetically sealed and maintained in a vacuum state. The vibration space may be filled with a gas, such as an inert gas.

Figure 3:
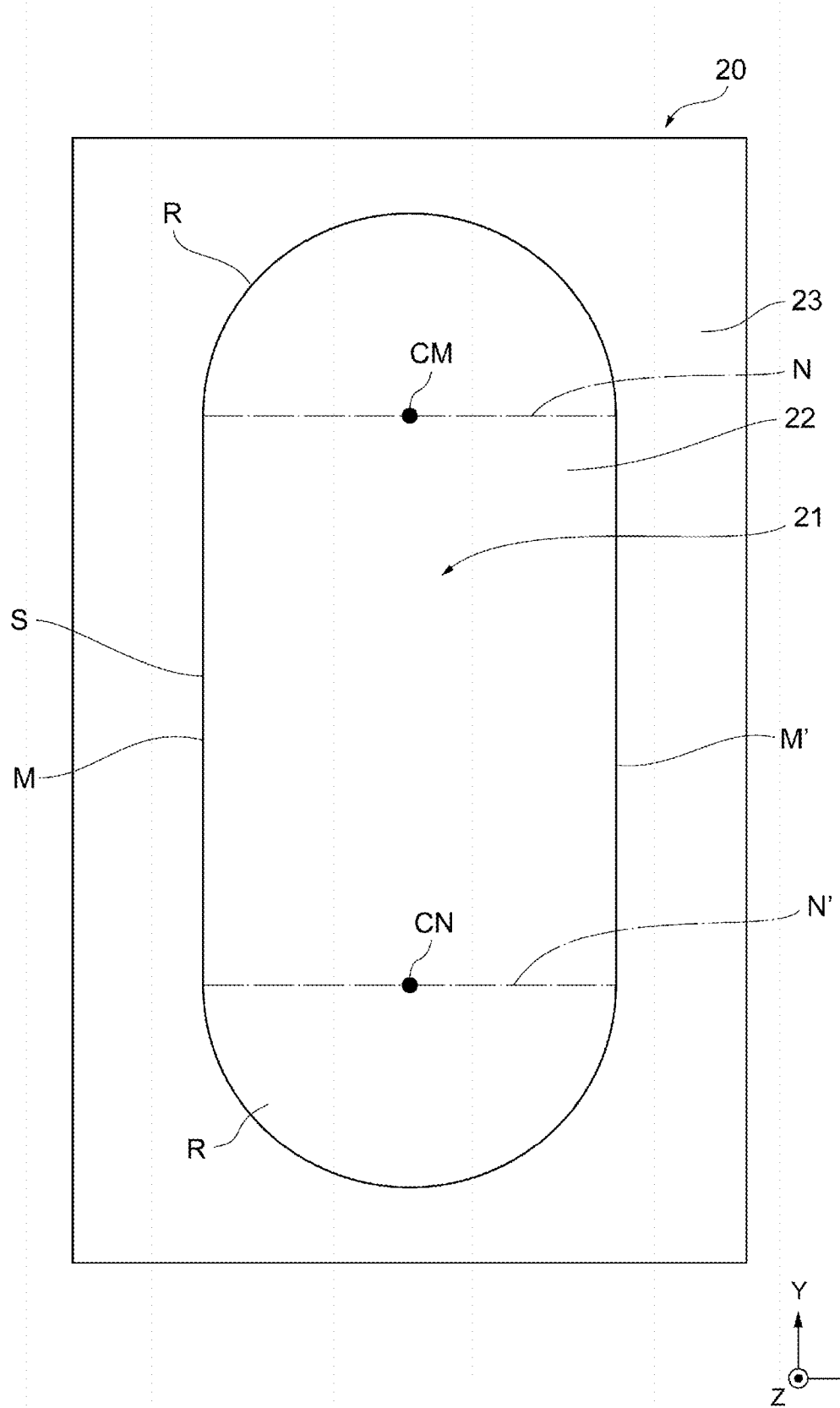
FIG. 3 is a plan view of a lower cover according to the first exemplary embodiment.

FIG. 3 is a plan view schematically illustrating a structure of the lower cover 20 according to the present embodiment. In FIG. 3, the long-side direction, the short-side direction, and the thickness direction of the lower cover 20 are a Y-axis direction, an X-axis direction, and a Z-axis direction, respectively. In plan view as viewed from the resonator 10, the recessed portion 21 has a shape composed of a space defined by a rectangle S (hereinafter also simply referred to as "rectangle S") and spaces defined by two arches R (hereinafter also simply referred to as "arches R"). In the exemplary aspect, the recessed portion 21 is not partitioned into the rectangle S and the arches R, and is formed by a single continuous space.

The rectangle S has long sides M and M' in the Y-axis direction, and has short sides N and N' in the X-axis direction. It is preferable that the rectangle S is larger than the area of a vibrating portion 120 (described below with respect to FIG. 4) and similar in shape to the vibrating portion 120.

The arches R are joined, at chords thereof, to a corresponding pair of sides of the rectangle S. The sides to which the arches R are joined are sides that face, in the Z-axis direction, sides of a retainer 140 (described below; see FIG. 4) connected to retaining arms 112A (113A) and 112B (113B). In the present embodiment, the retainer 140 connects, on sides of the retainer 140 parallel to the X-axis direction, to the vibrating portion 120 through the retaining arms 112A (113A) and 112B (113B). Therefore, the two arches R are positioned in such a manner that the chords thereof coincide with two short sides (indicated by dotted lines N and N' in FIG. 3) of the rectangle S parallel to the X-axis direction.

The radius of circles formed by arcs of the arches R is larger than the radius of circles formed by arcs of node generating portions 130A and 130B (described below; see FIG. 4). In the present embodiment, the arches R are semicircular in shape.

In the present embodiment, the chords of the arches R coincide with the respective short sides of the rectangle S and the arches R are semicircular in shape. Therefore, centers CM and CN of the circles formed by the arcs of the arches R are located on the sides N, N' of the rectangle S. The center CM of the circle is preferably provided at a position corresponding to a region in the retainer 140 (described below) equidistant from a connection point between the retaining arm 112A and the retainer 140 and a connection point between the retaining arm 113A and the retainer 140. Moreover, the center CN of the circle is preferably provided at a position corresponding to a region in the retainer 140 (described below) equidistant from a connection point between the retaining arm 112B and the retainer 140 and a connection point between the retaining arm 113B and the retainer 140.

When the recessed portion 21 has the arches R, even if vibration of the vibrating portion 120 (described below) propagates through the retaining arms 112A and 112B and leaks to the retainer 140 (see FIG. 4), the side wall 23 at the arc portions of the arches R can reflect the leaking vibration toward the centers CM and CN of the arches R. Thus, in the resonance device 1 according to the present embodiment, the vibration trapping capability of the resonator 10 can be improved.

(3. Resonator 10)

Figure 4:
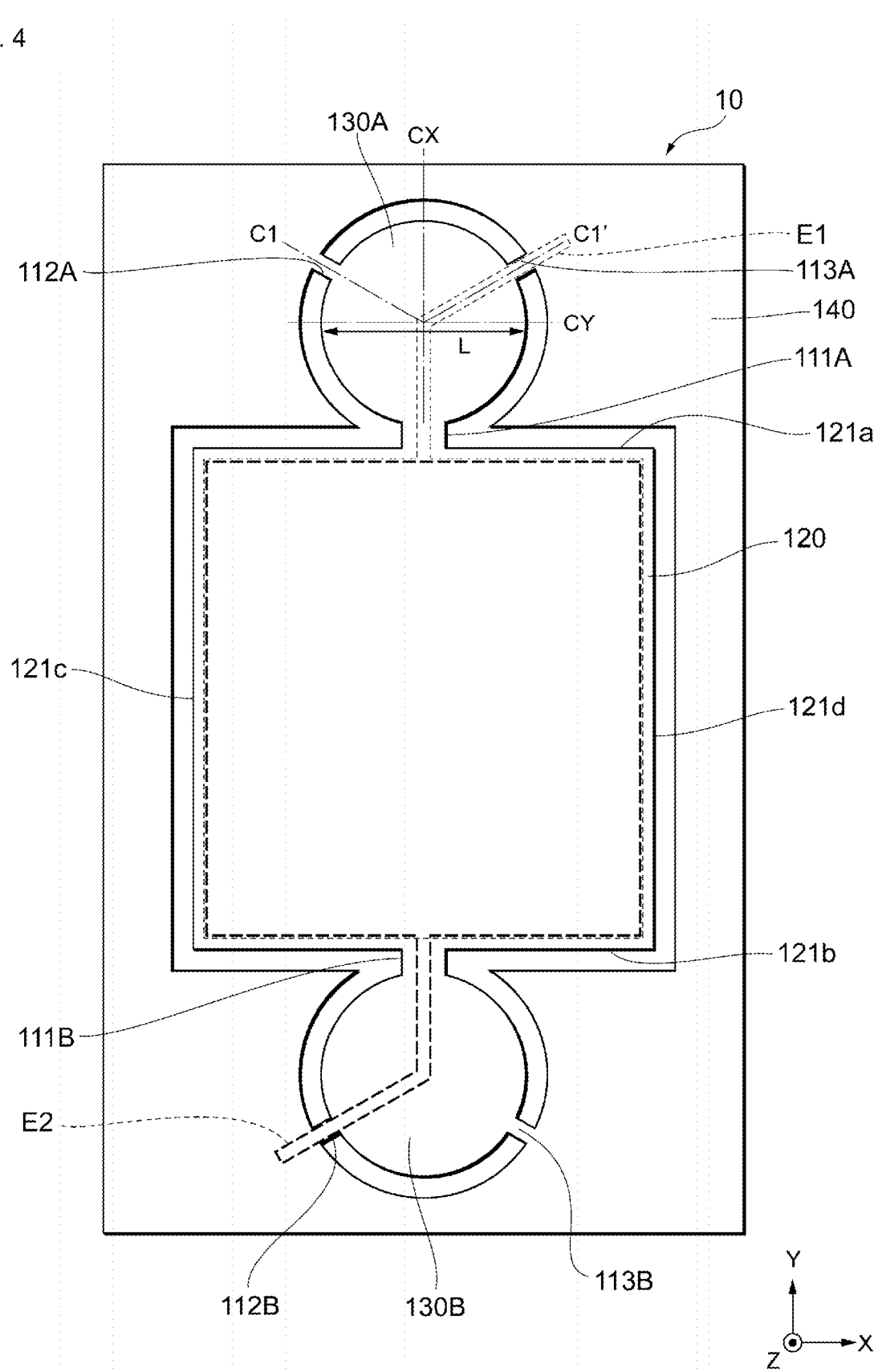
FIG. 4 is a plan view of a resonator according to the first exemplary embodiment, with an upper cover removed.

FIG. 4 is a plan view schematically illustrating a structure of the resonator 10 according to the present embodiment. Each component of the resonator 10 according to the present embodiment will be described using FIG. 4. The resonator 10 includes the vibrating portion 120 (an example of piezoelectric vibrating portion or a piezoelectric vibrator), the retainer 140, the node generating portion 130A (an example of first node generating portion or first node generator) and the node generating portion 130B (an example of second node generating portion or second node generator), a connecting arm 111A (an example of first connecting arm), a connecting arm 111B (an example of second connecting arm), the retaining arms 112A and 113A (an example of first retaining arms), and the retaining arms 112B and 113B (an example of second retaining arms).

(a) Vibrating Portion 120

The vibrating portion 120 has a contour substantially in a rectangular parallelepiped shape extending in a flat plate-like manner along the XY-plane in the rectangular coordinate system of FIG. 4. The term "substantially" as used herein is to account for minor variations in the shape that may occur during manufacture of the resonator, for example. Moreover, the vibrating portion 120 does not necessarily need to be of a flat plate-like shape and may be, for example, of a rectangular prism-like shape with a given thickness. The vibrating portion 120 has, in a region indicated by a dotted line, a rectangular plate-like metal layer E1 (an example of first electrode; the metal layer E1 formed on the vibrating portion 120 is also referred to as "upper electrode E1") having a length direction and a width direction. A metal layer E2 (an example of second electrode; the metal layer E2 formed on the vibrating portion 120 is also referred to as "lower electrode E2") is provided below the upper electrode E1 (see also FIGS. 5(A) and 5(B) as discussed below).

In FIG. 4, the vibrating portion 120 has a pair of short sides 121a and 121b in the X-axis direction, and has a pair of long sides 121c and 121d in the Y-axis direction. In an exemplary aspect of the present embodiment, for example, the length of the short sides 121a and 121b is set to about 100 µm, and the length of the long sides 121c and 121d is set to about 150 µm.

The upper electrode E1 and the lower electrode E2 have long sides in the Y-axis direction and short sides in the X-axis direction, and are formed on the vibrating portion 120.

As shown, the upper electrode E1 is extended from the vibrating portion 120 through the connecting arm 111A, the node generating portion 130A, and the retaining arm 112A to a region in the retainer 140 facing the short side 121a of the vibrating portion 120. Like the upper electrode E1, the lower electrode E2 is formed on the vibrating portion 120, and is extended from the vibrating portion 120 through the connecting arm 111B, the node generating portion 130B, and the retaining arm 112B to a region in the retainer 140 facing the short side 121b of the vibrating portion 120.

The vibrating portion 120 and the retainer 140 are provided with a space of a predetermined distance therebetween. In the example of FIG. 4, the vibrating portion 120 is connected on the pair of short sides 121a and 121b to the connecting arms 111A and 111B, and is retained by the retainer 140 through the node generating portions 130A and 130B and the retaining arms 112A, 113A, 112B, and 113B. On the other hand, the vibrating portion 120 does not connect to the retainer 140 on the pair of long sides 121c and 121d with a gap or space formed therebetween.

(b) Retainer 140

The outer shape of the retainer 140 is formed along the XY-plane in the shape of, for example, a rectangular frame. The inner shape of the retainer 140 is formed along the XY-plane in such a manner as to surround the outer side of the vibrating portion 120 and node generating portions 130A and 130B. That is, in the present embodiment, the retainer 140 is a frame-like member cut out of a rectangular flat plate along the outer edge of the vibrating portion 120 and node generating portions 130A and 130B. The space (gap) formed between the retainer 140 and the vibrating portion 120 and node generating portions 130A and 130B has a given distance.

It is noted that the retainer 140 does not necessarily need to have the frame-like shape, and may be of any shape as long as it is provided in at least part of the area surrounding the vibrating portion 120.

(c) Node Generating Portions 130A, 130B

The node generating portion 130A is provided between the short side 121a of the vibrating portion 120 and a region in the retainer 140 facing the short side 121a.

The node generating portion 130A is substantially symmetrical with respect to a virtual plane defined parallel to the XZ-plane along a center line CY in the Y-axis direction (an example of first direction). In the present embodiment, the node generating portion 130A is also substantially symmetrical with respect to a virtual plane defined parallel to the YZ-plane along a center line CX in the X-axis direction (an example of second direction). Specifically, in the present embodiment, the node generating portion 130A has a circular shape with a radius of about 34 µm.

The node generating portion 130A is connected to the connecting arm 111A at a vertex facing the short side 121a. A center line of the connecting arm 111A in the X-axis direction coincides with an extension of the center line CX of the node generating portion 130A in the X-axis direction.

The node generating portion 130A is connected to the retainer 140 by the retaining arms 112A and 113A. Specifically, the node generating portion 130A is connected to the retaining arm 112A on a line segment $C_1$ inclined from the center line CY of the node generating portion 130A in the Y-axis direction by about −45 degrees toward the Y-axis direction, with the point of intersection of the center lines CY and CX at the center, and extending toward the outside of the node generating portion 130A in a direction away from the vibrating portion 120. At the same time, the node generating portion 130A is connected to the retaining arm 113A on a line segment $C_1'$ inclined from the center line CY by about +45 degrees toward the Y-axis direction, with the point of intersection of the center lines CY and CX at the center, and extending toward the outside of the node generating portion 130A in a direction away from the vibrating portion 120.

A diameter L of the node generating portion 130A is preferably larger than the width of the connecting arm 111A in the X-axis direction. It is also preferable that the diameter L be smaller than the width of the vibrating portion 120 in the X-axis direction. It is more preferable that the diameter L be about 70% of the width of the vibrating portion 120 in the X-axis direction.

The node generating portion 130B has the same configuration as the node generating portion 130A and will not be repeated herein.

(d) Connecting Arms 111A, 111B

The connecting arm 111A is substantially rectangular in shape. The connecting arm 111A is connected at one end thereof to a center portion of the short side 121a of the vibrating portion 120, and extends therefrom toward the node generating portion 130A in a direction perpendicular to the short side 121a. The other end of the connecting arm 111A is connected in such a manner that the center thereof in the width direction coincides with the center line CX of the node generating portion 130A. In the present embodiment, the width of the connecting arm 111A in the X-axis direction is about 10 μm.

The connecting arm 111B has the same configuration as the connecting arm 111A and will not be repeated herein.

(e) Retaining Arms 112A, 113A, 112B, 113B

The retaining arm 112A is substantially rectangular in shape. The retaining arm 112A is disposed at a predetermined angle with respect to the Y-axis direction. This means that the retaining arm 112A does not coincide with an extension of the connecting arm 111A. The retaining arms 112A and 113A are structured to be substantially symmetrical with respect to a virtual plane defined parallel to the YZ-plane along the center line CX.

For example, the retaining arm 112A connects at one end thereof to the node generating portion 130A in such a manner that the line segment $C_1$ coincides with the center of the connecting arm 111A in a length (width) direction along the Y-axis direction. The retaining arm 112A then extends along an extension of the line segment $C_1$, and connects to the retainer 140 at a point of contact of the retainer 140 with the extension of the line segment $C_1$. The width of the retaining arm 112A is preferably smaller than or equal to the length (width) of the connecting arm 111A along the X-axis direction. In the present embodiment, the width of the retaining arm 112A is about 5 μm, which is smaller than the width of the connecting arm 111A. By making the width of the retaining arm 112A smaller than the width of the connecting arm 111A, it is possible to reduce propagation of vibration from the node generating portion 130A to the retainer 140.

The retaining arms 113A, 112B, and 113B have the same configuration as the retaining arm 112A and will not be repeated herein.

In a refinement of the exemplary aspect, the resonator 10 does not necessarily include both the retaining arms 112A and 113A as components for connecting the node generating portion 130A to the retainer 140, and may include only one of them. Similarly, the resonator 10 does not necessarily include both the retaining arms 112B and 113B as components for connecting the node generating portion 130B to the retainer 140, and may include only one of them.

(4. Layered Structure)

A layered structure (cross-sectional structure) of the resonance device 1 will be described using FIGS. 5(A) and 5(B).

Figure 5A:
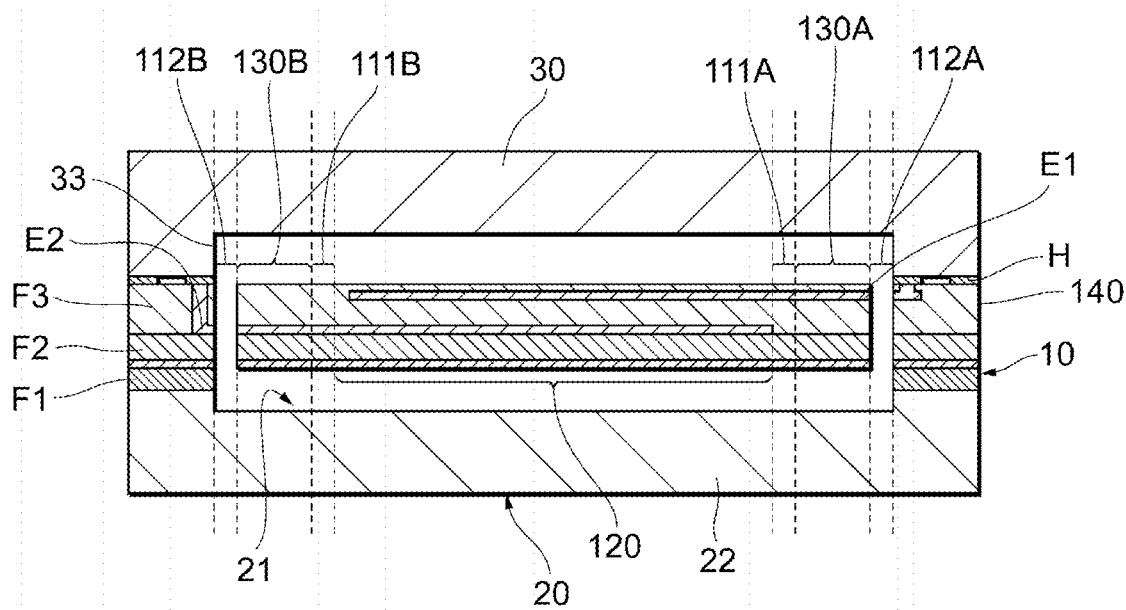
FIGS. 5(A)-(B) are cross-sectional views of FIG. 1.
Figure 5B:
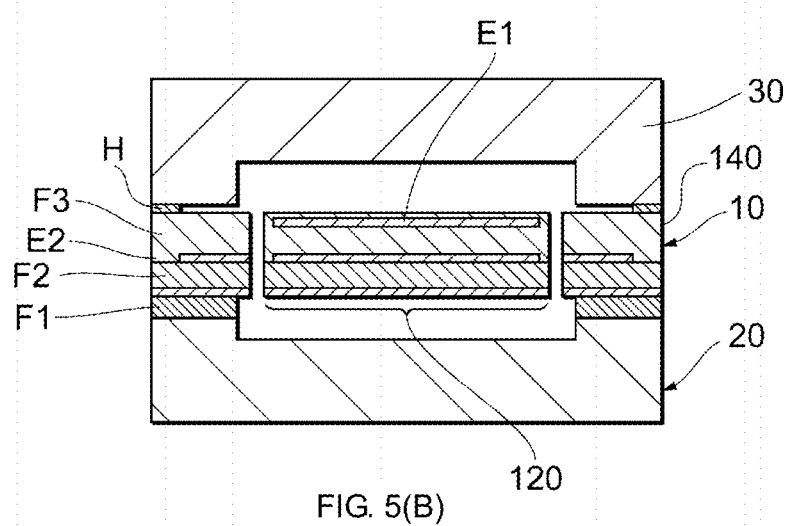

FIG. 5(A) is a cross-sectional view taken along line AA' of FIG. 1, and FIG. 5(B) is a cross-sectional view taken along line BB' of FIG. 1.

As illustrated in FIGS. 5(A) and 5(B), in the resonance device 1 according to the present embodiment, the side wall 23 of the lower cover 20 and the retainer 140 of the resonator 10 are joined together, and the retainer 140 of the resonator 10 and the side wall 33 of the upper cover 30 are joined together. Thus, the resonator 10 is retained between the lower cover 20 and the upper cover 30, and the vibration space where the vibrating portion 120 vibrates is formed between the lower cover 20 and the upper cover 30.

In the exemplary embodiment, the bottom plate 22 and the side wall 23 of the lower cover 20 are integrally formed of silicon (Si). A silicon dioxide ($SiO_2$) film F1 is formed on the upper surface of the side wall 23. By the $SiO_2$ film F1, the lower cover 20 is joined to the retainer 140 of the resonator 10. The thickness of the lower cover 20 defined in the Z-axis direction is, for example, 150 μm, and the depth of the recessed portion 21 is, for example, 50 μm.

The upper cover 30 is formed by a silicon (Si) wafer of a predetermined thickness. As illustrated in FIG. 5(A), the upper cover 30 is joined at its perimeter (side wall 33) to the retainer 140 of the resonator 10. A joining layer H is formed between an edge portion of the upper cover 30 and the retainer 140, and the upper cover 30 is joined by the joining layer H to the retainer 140. The joining layer H is formed by, for example, a gold (Au) film and a tin (Sn) film.

The retainer 140, the vibrating portion 120, the node generating portions 130A and 130B, the connecting arms 111A and 111B, and the retaining arms 112A, 113A, 112B, and 113B of the resonator 10 are formed in the same process. Specifically, the metal layer E2 is first formed on a silicon (Si) layer F2. Next, a piezoelectric thin film F3 is formed on the metal layer E2 in such a manner as to cover the metal layer E2. Then, the metal layer E1 is formed on the piezoelectric thin film F3, and another piezoelectric thin film F3 is formed on the metal layer E1.

The Si layer F2 is made of, for example, a degenerate n-type Si semiconductor having a thickness of about 30 μm, and may contain phosphorus (P), arsenic (As), or antimony (Sb) as an n-type dopant. A resistance value of the degenerate Si used for the Si layer F2 preferably ranges from 0.5 mΩ·cm to 0.9 mΩ·cm. The resistance value of the degenerate Si used in the present embodiment is, for example, 0.63 mΩ·cm. An $SiO_2$ film may be formed on the lower surface of the Si layer F2. This makes it possible to improve the temperature characteristic of the vibrating portion 120.

The metal layers E2 and E1 are formed using, for example, a molybdenum (Mo) or aluminum (Al) layer of a thickness of about 0.1 μm. When degenerate Si is used for the Si layer F2, the Si layer F2, instead of the metal layer E2, may be used as a lower electrode.

The metal layers E2 and E1 are formed into a desired shape by etching or the like. On the vibrating portion 120, the metal layer E2 is formed in such a manner as to function as the lower electrode E2. On the node generating portions 130A and 130B, the connecting arms 111A and 111B, the retaining arms 112A, 113A, 112B, and 113B, and the retainer 140, the metal layer E2 is formed in such a manner as to function as a wire for connecting the lower electrode E2 to an alternating-current power supply provided outside the resonator 10.

On the other hand, for example, on the vibrating portion 120, the metal layer E1 is formed in such a manner as to function as the upper electrode E1. On the node generating portions 130A and 130B, the connecting arms 111A and 111B, the retaining arms 112A, 113A, 112B, and 113B, and the retainer 140, the metal layer E1 is formed in such a manner as to function, for example, as a wire for connecting the upper electrode E1 to the alternating-current power supply provided outside the resonator 10.

For connection from the alternating-current power supply to the lower wire or upper wire, an electrode may be formed on the outer surface of the upper cover 30 so that the electrode connects the alternating-current power supply to the lower wire or upper wire. Alternatively, a via may be formed in the upper cover 30 and filled with a conductive material to form a wire so that the wire connects the alternating-current power supply to the lower wire or upper wire.

The piezoelectric thin film F3 is a thin film of a piezoelectric material that converts an applied voltage into vibration. For example, the piezoelectric thin film F3 may be mainly composed of a nitride, such as aluminum nitride (AlN), or an oxide. Specifically, the piezoelectric thin film F3 may be made of scandium aluminum nitride (ScAlN). ScAlN is produced by substituting scandium for part of aluminum in the aluminum nitride. In an exemplary aspect, the piezoelectric thin film F3 has a thickness of, for example, 1 μm.

In accordance with an electric field applied to the piezoelectric thin film F3 by the metal layers E2 and E1, the piezoelectric thin film F3 expands and contracts in an in-plane direction of the XY-plane. As the piezoelectric thin film F3 expands and contracts, contour vibration of the vibrating portion 120 occurs in the X-axis direction. The vibration of the vibrating portion 120 propagates through the connecting arms 111A and 111B to the node generating portions 130A and 130B.

Figure 6:
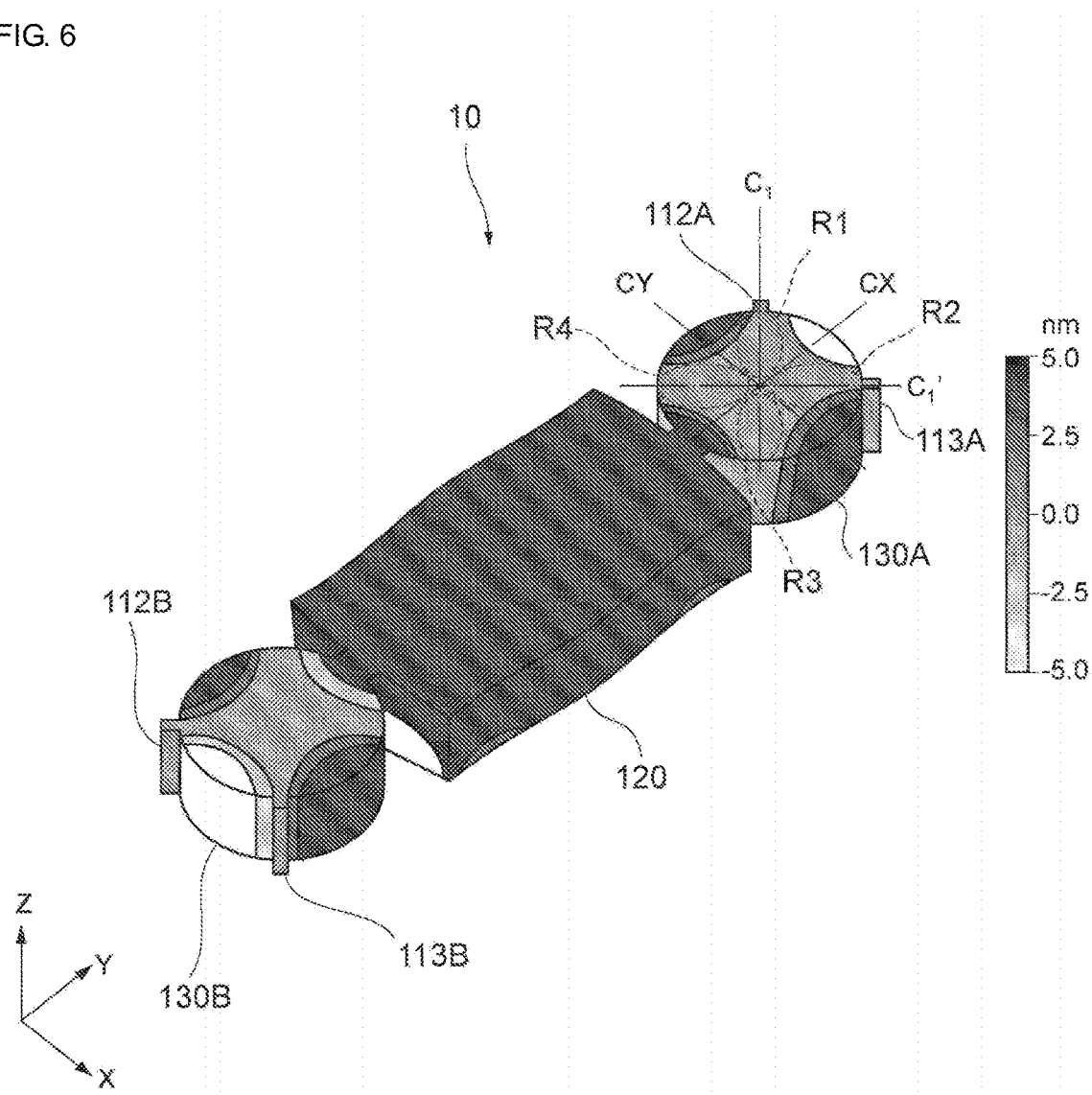
FIG. 6 is a diagram illustrating displacement of the resonator according to the first exemplary embodiment.

FIG. 6 is a diagram schematically illustrating a distribution obtained by breaking down vibrational displacement of the resonator 10 according to the present embodiment into Z-axis components. In each diagram of FIG. 6, portions indicated in light gray represent areas with small displacement, and portions indicated in white and portions indicated in dark gray represent areas with large displacement. Specifically, the portions indicated in dark gray represent displacement in the positive direction of each axis, and the portions indicated in white represent displacement in the negative direction of each axis.

As illustrated in FIG. 6, the vibrating portion 120 also vibrates in the Z-axis direction. As illustrated in FIG. 5, the resonator 10 is formed by stacking materials of different acoustic velocities. This means that each layer of the resonator 10 has a different elastic characteristic. Thus, even when the vibrating portion 120 performs in-plane vibration, vibration in the Z-axis direction is generated in the vibrating portion 120.

At some moments during vibration, the vibrating portion 120 is displaced in the positive direction of the Z-axis in the center thereof, and displaced in the negative direction of the Z-axis at four corners thereof.

The displacement of the node generating portion 130A in the Z-axis direction is substantially symmetrical with respect to both a plane defined parallel to the YZ-plane along the center line CX and a plane defined parallel to the XZ-plane along the center line CY. Thus, at vertices of regions R1 to R4 in the vicinities of the line segments C1 and C1' inclined about 45 degrees from the center lines CX and CY in the node generating portion 130A, a plurality of regions (which may hereinafter be also referred to as "node regions") are created where the degree of vibrational displacement in the Z-axis direction is smaller than in their surrounding areas.

In the present embodiment, the retaining arms 112A and 113A are formed in such a manner as to connect to the node regions in the node generating portion 130A. Thus, vibration generated in the vibrating portion 120 is cancelled out by the retaining arms 112A and 113A, and does not propagate to the retainer 140. This makes it possible to reduce anchor loss in the resonator 10 and improve the Q-factor.

The displacement of the node generating portion 130B is distributed in the same manner as in the node generating portion 130A and will not be repeated herein.

Figure 7:
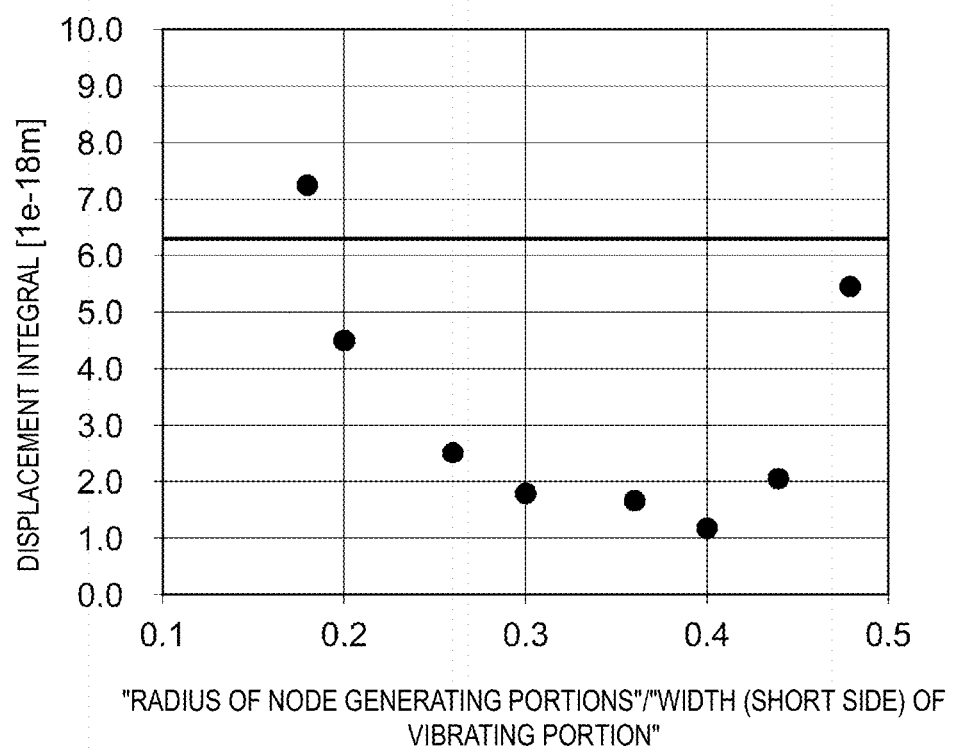
FIG. 7 is a graph showing a correlation between the radius of node generating portions with respect to the width of a vibrating portion and a displacement integral value at a connection point between a retaining arm and a retainer, according to the first exemplary embodiment.

FIG. 7 is a graph which compares, between the resonator 10 of the present embodiment and a resonator 10' of a comparative example, displacement integrals at connection points of retainers and retaining arms. In the example of FIG. 7, a resonator including a vibrating portion and a retainer that are the same as those of the resonator 10 of the present embodiment is used as the resonator 10' of the comparative example. When the resonator 10 and the resonator 10' are compared, the vibrating portion 120 of the resonator 10 connects to the retainer through the connecting arms 111A and 111B, the node generating portions 130A and 130B, and the retaining arms 112A, 113A, 112B, and 113B, whereas the vibrating portion of the resonator 10' connects to the retainer through the retaining arms.

In FIG. 7, the vertical axis represents a value obtained by integrating displacement in the retaining arm with respect to the area of the retaining arm, and the horizontal axis represents the ratio of the radius of the node generating portions 130A and 130B to the length of the short side 121a of the vibrating portion 120. Since the resonator 10' of the comparative example includes no node generating portions, the displacement integral is always constant (as indicated by a thick line in the graph) regardless of the value in the horizontal axis. Values indicated by dots in FIG. 7 are displacement integrals of the resonator 10 according to the present embodiment.

In FIG. 7, in the range of about 0.2 to about 0.48 in the horizontal axis, the displacement integrals of the resonator 10 are smaller than that of the resonator 10'. Anchor loss is a value that increases in proportion to the displacement integral. The graph of FIG. 7 thus shows that with the node generating portions 130A and 130B, the anchor loss is greatly reduced. In particular, the anchor loss is found to be most greatly reduced when the ratio of the radius of the node generating portions 130A and 130B to the length of the short side 121a of the vibrating portion 120 is from about 0.3 to about 0.45.

Second Embodiment

In second and subsequent embodiments, the explanation of matters common to those in the first embodiment will be omitted, and only differences will be explained. In particular, the same operational advantage achieved by the same configuration will not be mentioned one by one in each embodiment.

Figure 8:
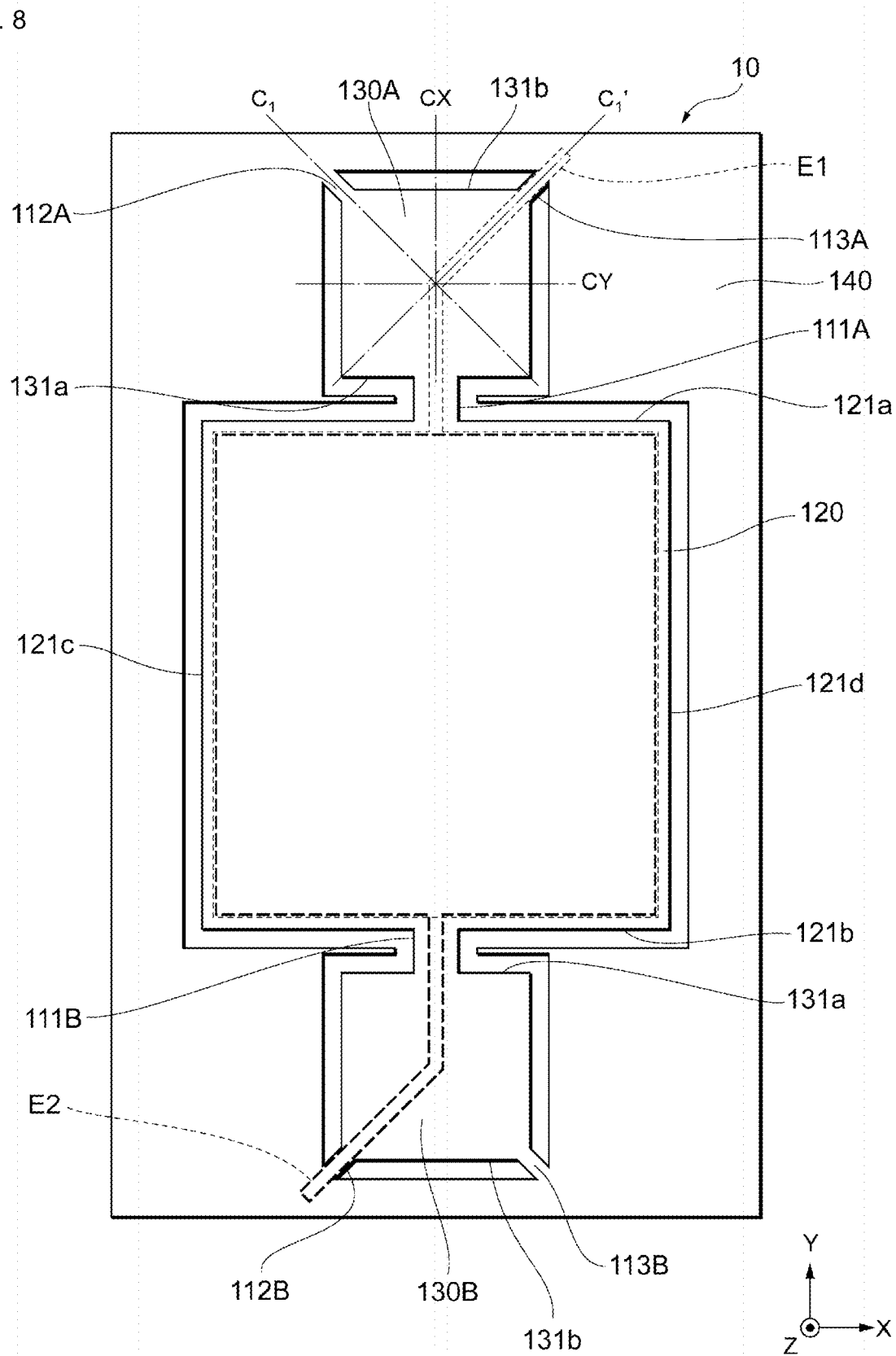
FIG. 8 is a plan view corresponding to FIG. 4 and illustrating a resonator according to a second exemplary embodiment with the upper cover removed.

FIG. 8 is an exemplary plan view of the resonator 10 according to the second exemplary embodiment. Of details of the configuration of the resonance device 1 according to the present embodiment, differences from the first embodiment will be mainly described.

(2-1) Node Generating Portions 130A, 130B

In the present embodiment, the node generating portion 130A is substantially square in shape. In the node generating portion 130A according to the present embodiment, a side 131a facing the short side 121a of the vibrating portion 120 is disposed parallel to the short side 121a. The length of each side of the node generating portion 130A is preferably set to about 50 µm. The other configurations of the node generating portion 130A are the same as those of the first embodiment. Note that the configuration of the node generating portion 130B is the same as that of the node generating portion 130A.

(2-2) Connecting Arms 111A, 111B

In the present embodiment, the connecting arm 111A connects at one end thereof to the node generating portion 130A in the center of the side 131a of the node generating portion 130A in the X-axis direction. The other configurations of the connecting arm 111A are the same as those of the first embodiment. Note that the configuration of the connecting arm 111B is the same as the configuration of the connecting arm 111A.

(2-3) Retaining Arms 112A, 113A, 112B, 113B

In the present embodiment, the line segment C1 coincides with a diagonal of the node generating portion 130A. The retaining arm 112A connects at one end thereof to the node generating portion 130A at one end of a side 131b of the node generating portion 130A facing the retainer 140. The retaining arm 112A then extends along an extension of the diagonal C1, and connects at the other end thereof to the retainer 140 at a point of contact of the retainer 140 with the extension of the diagonal C1. The other configurations of the retaining arm 112A are the same as those of the first embodiment. Note that the configuration of the retaining arms 113A, 112B, and 113B is the same as the configuration of the retaining arm 112A.

Figure 9:
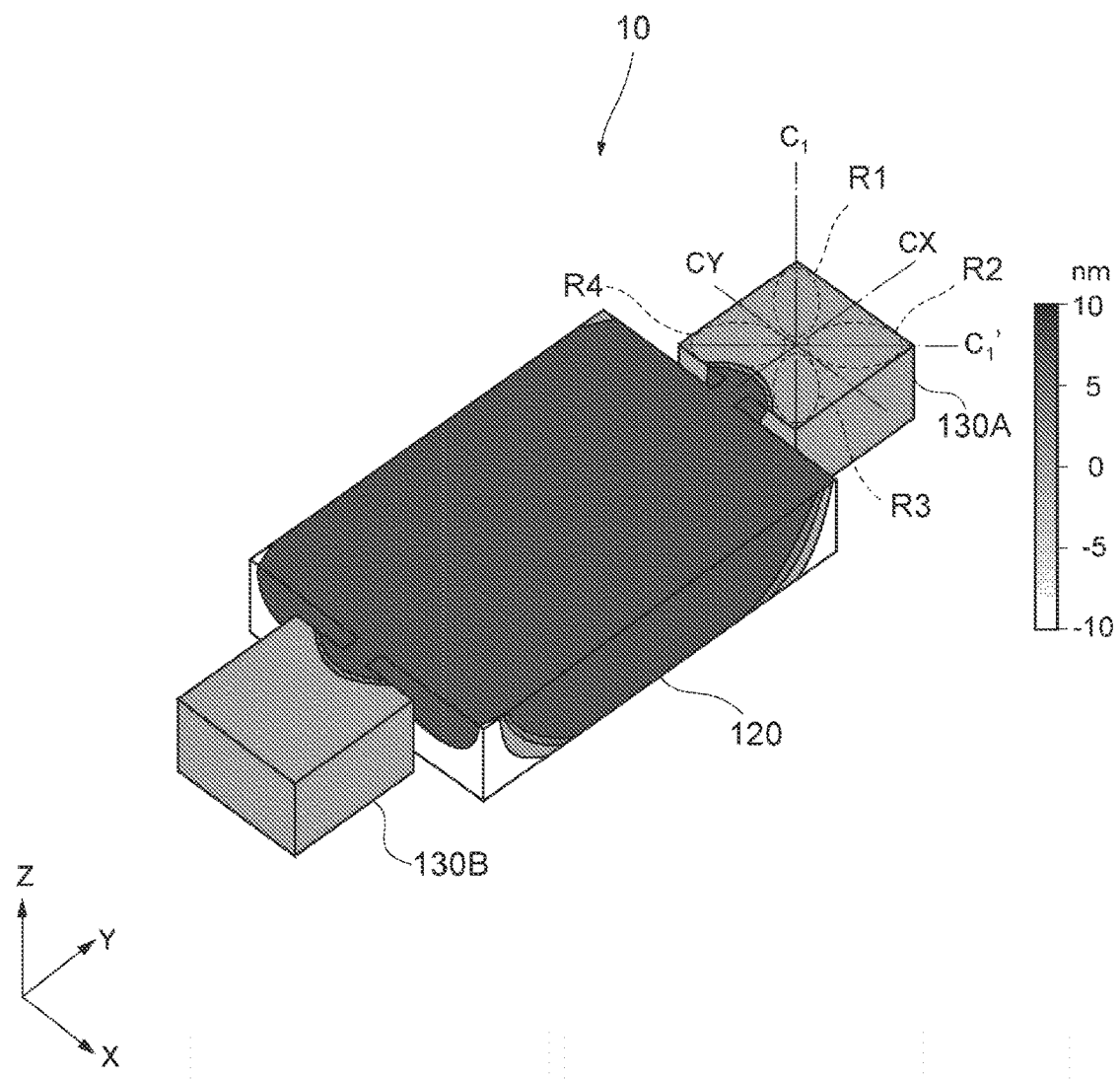
FIG. 9 is a diagram corresponding to FIG. 6 and illustrating displacement of the resonator according to the second exemplary embodiment.

FIG. 9 is a diagram corresponding to FIG. 6 of the first embodiment. This diagram breaks down vibrational displacement of the resonator 10 according to the present embodiment into Z-axis components.

As illustrated in FIG. 9, the displacement of the node generating portion 130A in the Z-axis direction is substantially symmetrical with respect to both a plane defined parallel to the YZ-plane along the center line CX and a plane defined parallel to the XZ-plane along the center line CY. Thus, in the regions R1 to R4 in the vicinities of the line segments C1 and C1' in the node generating portion 130A, vibrational displacement in the Z-axis direction is reduced.

The other configurations and operational advantages are the same as those of the first embodiment.

Third Embodiment

Figure 10:
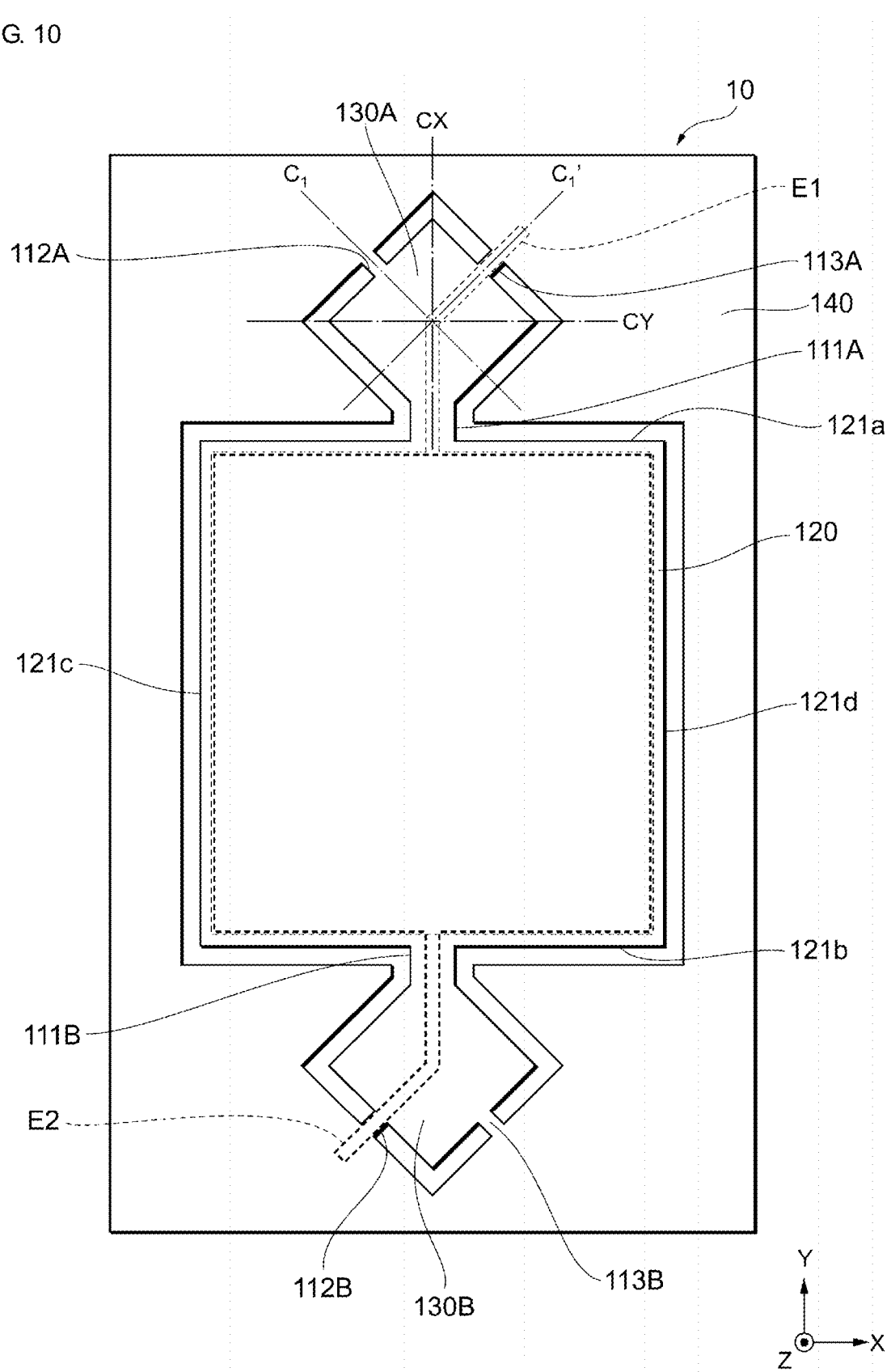
FIG. 10 is a plan view corresponding to FIG. 4 and illustrating a resonator according to a third exemplary embodiment with the upper cover removed.

FIG. 10 is an exemplary plan view of the resonator 10 according to the present embodiment. Of details of the configuration of the resonance device 1 according to the present embodiment, differences from the first embodiment will be mainly described.

(3-1) Node Generating Portions 130A, 130B

In the present embodiment, the node generating portion 130A has a substantially diamond shape whose diagonals are along the Y-axis direction and the X-axis direction. Adjacent interior angles of the node generating portion 130A do not necessarily need to be equal. The configuration of the node generating portion 130B is the same as that of the node generating portion 130A. The other configurations of the node generating portions 130A and 130B are the same as those of the first embodiment.

(3-2) Connecting Arms 111A, 111B

In the present embodiment, the connecting arm 111A connects at one end thereof to the node generating portion 130A at a vertex of the node generating portion 130A facing the short side 121a of the vibrating portion 120. The other configurations of the connecting arm 111A are the same as those of the first embodiment. Note that the configuration of the connecting arm 111B is the same as the configuration of the connecting arm 111A.

(3-3) Retaining Arms 112A, 113A, 112B, 113B

In the present embodiment, the line segment C1 coincides with a line segment that connects the centers of corresponding sides of the node generating portion 130A. The retaining arm 112A connects at one end thereof to the node generating portion 130A in the center of the side of the node generating portion 130A facing the retainer 140. The retaining arm 112A extends along an extension of the line segment C1, and connects at the other end thereof to the retainer 140 at a point of contact of the retainer 140 with the extension of the line segment C1. The other configurations of the retaining arm 112A are the same as those of the first embodiment. Note that the configuration of the retaining arms 113A, 112B, and 113B is the same as the configuration of the retaining arm 112A.

Fourth Embodiment

Figure 11:
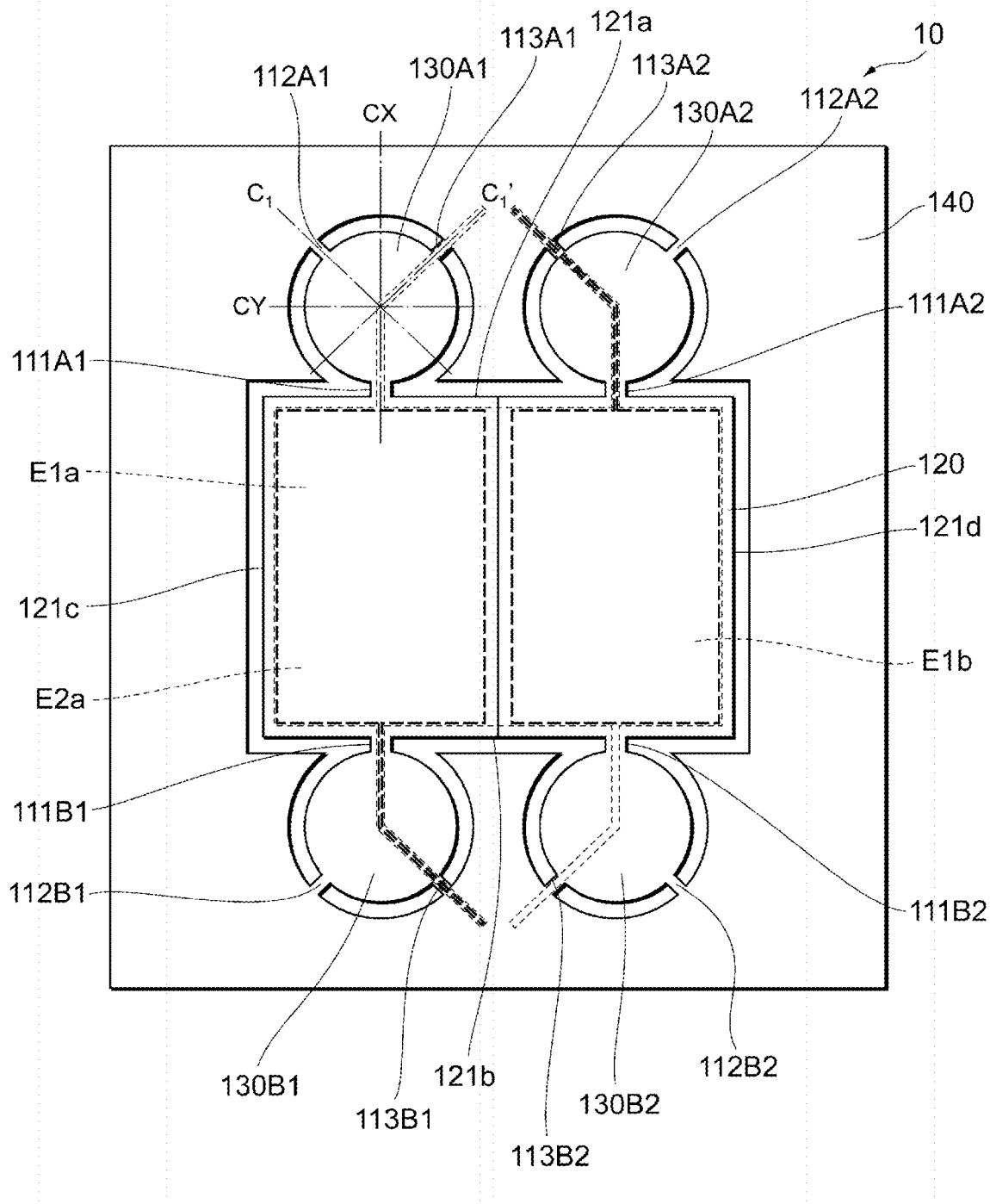
FIG. 11 is a plan view corresponding to FIG. 4 and illustrating a resonator according to a fourth exemplary embodiment with the upper cover removed.

FIG. 11 is an exemplary plan view of the resonator 10 according to the present embodiment. Of details of the configuration of the resonance device 1 according to the present embodiment, differences from the first embodiment will be mainly described.

In the present embodiment, as components corresponding to the node generating portions 130A and 130B, the connecting arms 111A and 111B, and the retaining arms 112A, 113A, 112B, and 113B of the first embodiment, the resonator 10 includes node generating portions 130A1, 130A2, 130B1, and 130B2, connecting arms 111A1, 111A2, 111B1, and 111B2, and retaining arms 112A1, 112A2, 113A1, 113A2, 112B1, 112B2, 113B1, and 113B2.

(4-1) Vibrating Portion 120

In the present embodiment, the vibrating portion 120 has long sides in the X-axis direction and has short sides in the Y-axis direction. Two rectangular plate-like upper electrodes E1a and E1b having a length direction and a width direction are provided on the vibrating portion 120. A lower electrode E2a facing the upper electrodes E1a and E1b is provided below the upper electrodes E1a and E1b.

The upper electrodes E1a and E1b have long sides in the Y-axis direction and have short sides in the X-axis direction, and are formed on the vibrating portion 120.

The upper electrode E1a is extended from the vibrating portion 120 through the connecting arm 111A1, the node generating portion 130A1, and the retaining arm 112A1 to a region in the retainer 140 facing the short side 121a. On the other hand, the upper electrode E1b is extended from the vibrating portion 120 through the connecting arm 111B1, the node generating portion 130B1, and the retaining arm 112B1 to a side in the retainer 140 facing the short side 121b.

The lower electrode E2a has long sides in the X-axis direction and has short sides in the Y-axis direction, and is formed on the vibrating portion 120. The lower electrode E2a is extended from the vibrating portion 120 through the connecting arms 111A1, 111A2, 111B1, and 111B2, the node generating portions 130A1, 130A2, 130B1, and 130B2, and the retaining arms 112A1, 112A2, 112B1, and 112B2 to a region in the retainer 140 facing the short side 121a and a region in the retainer 140 facing the short side 121b.

The other configurations of the vibrating portion 120 are the same as those of the first embodiment.

(4-2) Node Generating Portions 130A1, 130A2, 130B1, 130B2

The node generating portion 130A1 is disposed so as to face the upper, short side of the upper electrode E1a.

The node generating portion 130A1 is connected to the connecting arm 111A1 on the center line CX in the X-axis direction. At the same time, the node generating portion 130A1 is connected to the retaining arms 112A1 and 113A1 at positions symmetrical with respect to the center line CX. The other configurations of the node generating portion 130A1 are the same as those of the node generating portion 130A according to the first embodiment.

It is noted that the configuration of the node generating portions 130A2, 130B1, and 130B2 is the same as the configuration of the node generating portion 130A1 and will not be repeated herein.

(4-3) Connecting Arms 111A1, 111A2, 111B1, 111B2

In the present embodiment, the connecting arm 111A1 connects at one end thereof to the short side 121a at a center portion of the upper electrode E1a in the X-axis direction, and extends therefrom toward the node generating portion 130A1. The other end of the connecting arm 111A1 connects to the node generating portion 130A1 in such a manner that the center of the connecting arm 111A in the X-axis direction coincides with the center line CX of the node generating portion 130A1. The other configurations of the connecting arm 111A1 are the same as those of the first embodiment.

It is noted that the configuration of the connecting arms 111A2, 111B1, and 111B2 is the same as the configuration of the connecting arm 111A1 and will not be repeated herein.

(4-4) Retaining Arms 112A1, 112A2, 113A1, 113A2, 112B1, 112B2, 113B1, 113B2

The retaining arm 112A1 according to the present embodiment connects at one end thereof to the node generating portion 130A1 in such a manner that the center of the retaining arm 112A1 in the width direction thereof coincides with the line segment $C_1$. The retaining arm 112A1 then extends along an extension of the line segment $C_1$, and connects to the retainer 140 at a point of contact of the retainer 140 with the extension of the line segment $C_1$. On the other hand, the retaining arm 113A1 according to the present embodiment connects at one end thereof to the node generating portion 130A1 in such a manner that the center of the retaining arm 113A1 in the width direction thereof coincides with the line segment $C_1'$. The retaining arm 113A1 then extends along an extension of the line segment $C_1'$, and connects to the retainer 140 at a point of contact of the retainer 140 with the extension of the line segment $C_1'$. The other configurations of the retaining arms 112A1 and 113A1 are the same as those of the retaining arms 112A and 113A of the first embodiment.

It is noted that the configurations of the retaining arms 112A2, 113A2, 112B1, 112B2, 113B1, and 113B2 are the same as the configurations of the retaining arms 112A1 and 113A1 and will not be repeated herein.

Fifth Embodiment

Figure 12:
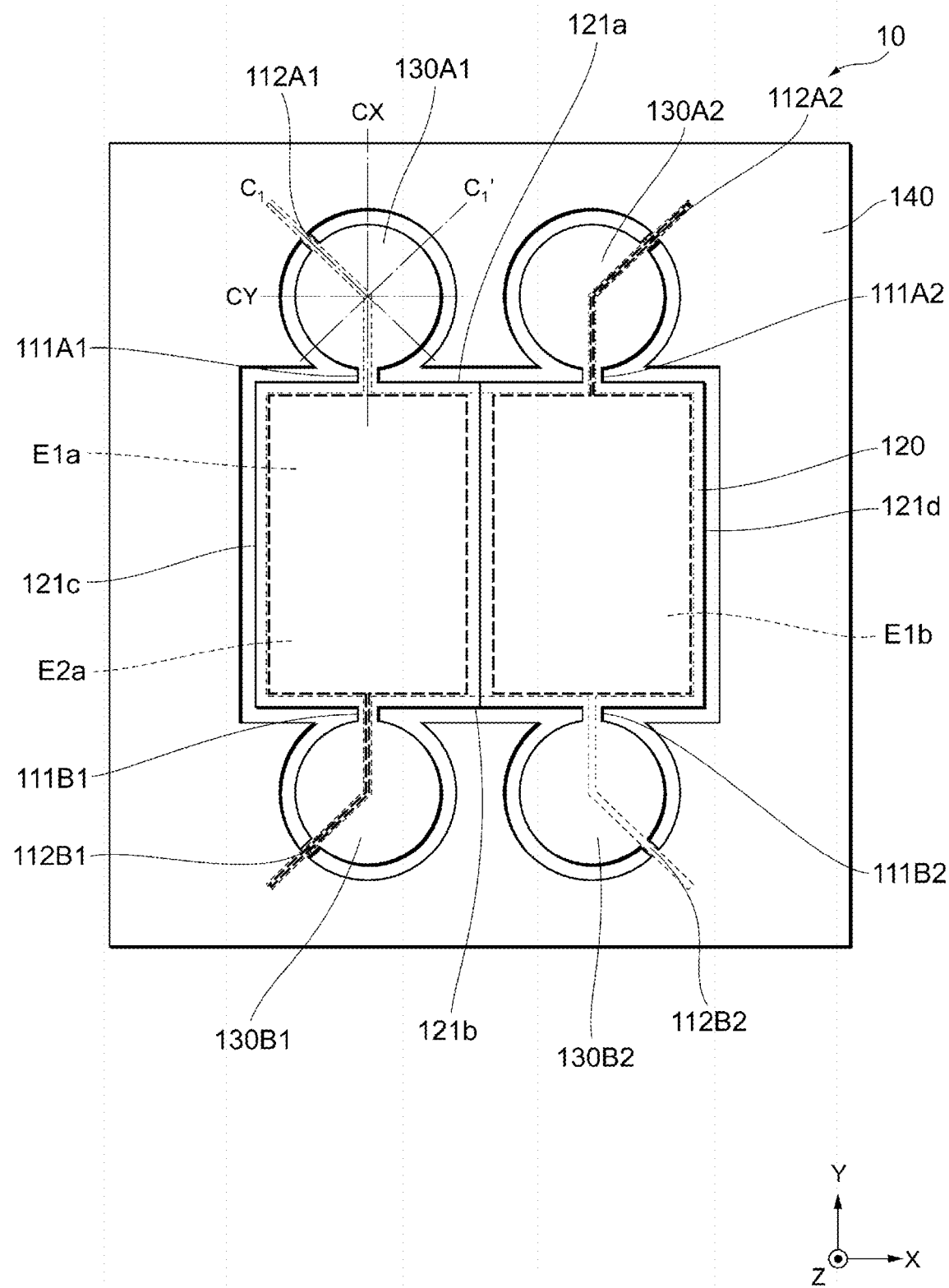
FIG. 12 is a plan view corresponding to FIG. 4 and illustrating a resonator according to a fifth exemplary embodiment with the upper cover removed.

FIG. 12 is an exemplary plan view of the resonator 10 according to the present embodiment. Of details of the configuration of the resonance device 1 according to the present embodiment, differences from the first embodiment will be mainly described.

In the present embodiment, as components corresponding to the node generating portions 130A and 130B, the connecting arms 111A and 111B, and the retaining arms 112A and 112B of the first embodiment, the resonator 10 includes the node generating portions 130A1, 130A2, 130B1, and 130B2, the connecting arms 111A1, 111A2, 111B1, and 111B2, and the retaining arms 112A1, 112A2, 112B1, and 112B2. Note that in the present embodiment, the resonator 10 does not include components corresponding to the retaining arms 113A and 113B of the first embodiment.

(5-1) Vibrating Portion 120

The configuration of the vibrating portion 120 according to the present embodiment is the same as the configuration of the vibrating portion 120 according to the fourth embodiment.

(5-2) Node Generating Portions 130A1, 130A2, 130B1, 130B2

The node generating portion 130A1 according to the present embodiment is disposed so as to face the upper, short side of the upper electrode E1a.

The node generating portion 130A1 is connected to the connecting arm 111A1 on the center line CX in the X-axis direction. At the same time, the node generating portion 130A1 is connected to the retaining arm 112A1 in such a manner that the line segment $C_1'$ coincides with the center of the retaining arm 113A1 in the width direction thereof. The other configurations of the node generating portion 130A1 are the same as those of the node generating portion 130A according to the first embodiment.

It is noted that the configuration of the node generating portions 130A2, 130B1, and 130B2 is the same as the configuration of the node generating portion 130A1 and will not be repeated herein.

(5-3) Connecting Arms 111A1, 111A2, 111B1, 111B2

The configuration of the connecting arms 111A1, 111A2, 111B1, and 111B2 according to the present embodiment is the same as the configuration of the connecting arms 111A1, 111A2, 111B1, and 111B2 according to the fourth embodiment.

(5-4) Retaining Arms 112A1, 112A2, 112B1, 112B2

The configuration of the retaining arms 112A1, 112A2, 112B1, and 112B2 according to the present embodiment is the same as the configuration of the retaining arms 112A1, 112A2, 112B1, and 112B2 according to the fourth embodiment.

The other configurations and advantages are the same as those of the first embodiment.

Sixth Embodiment

Figure 13:
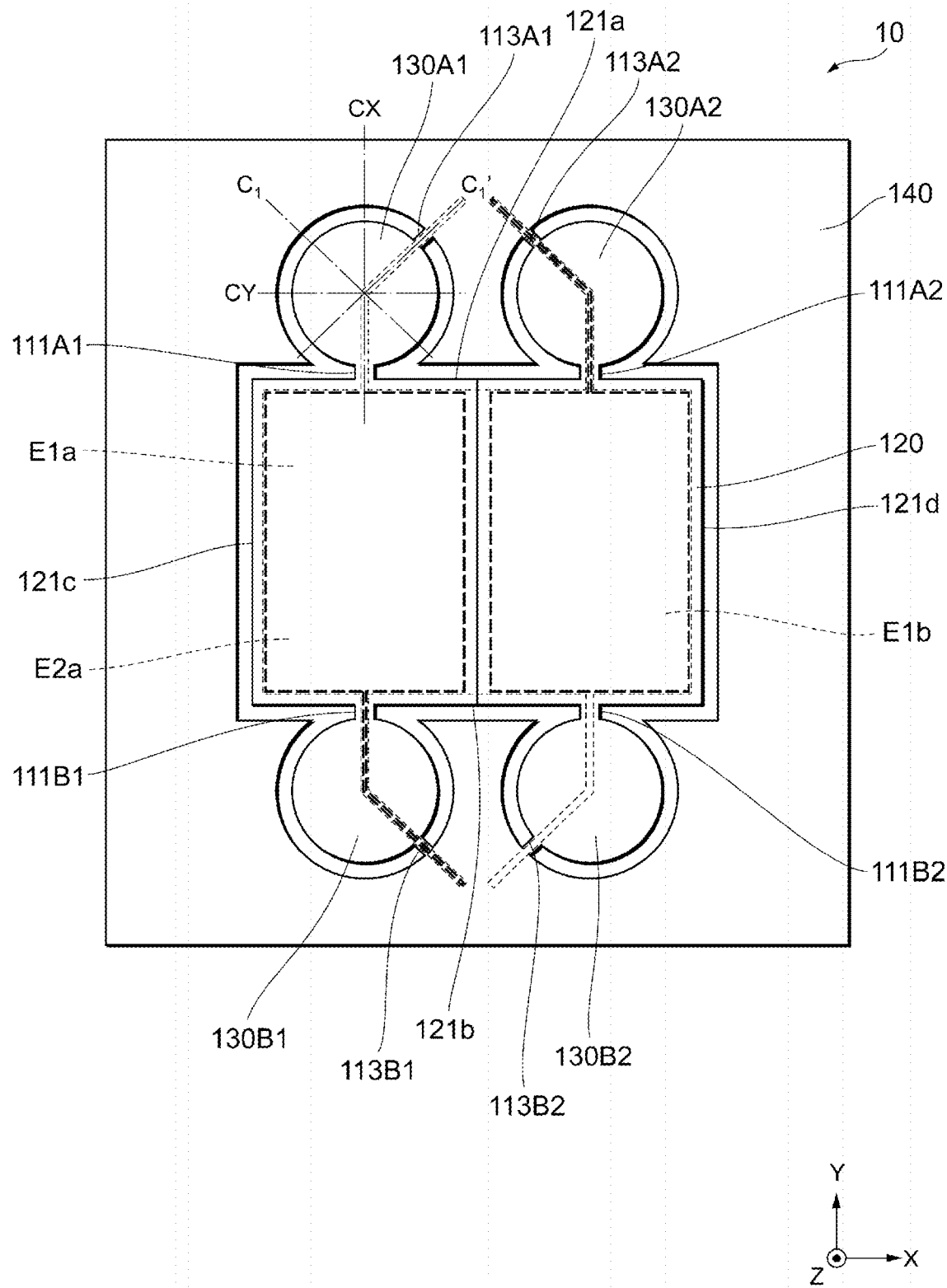
FIG. 13 is a plan view corresponding to FIG. 4 and illustrating a resonator according to a sixth exemplary embodiment with the upper cover removed.

FIG. 13 is an exemplary plan view of the resonator 10 according to the present embodiment. Of details of the configuration of the resonance device 1 according to the present embodiment, differences from the first embodiment will be mainly described.

In the present embodiment, as components corresponding to the node generating portions 130A and 130B, the connecting arms 111A and 111B, and the retaining arms 112A and 112B of the first embodiment, the resonator 10 includes the node generating portions 130A1, 130A2, 130B1, and 130B2, the connecting arms 111A1, 111A2, 111B1, and 111B2, and the retaining arms 112A1, 112A2, 112B1, and 112B2. Note that in the present embodiment, the resonator 10 does not include components corresponding to the retaining arms 112A and 112B of the first embodiment.

(6-1) Vibrating Portion 120

The configuration of the vibrating portion 120 according to the present embodiment is the same as the configuration of the vibrating portion 120 according to the fourth embodiment.

(6-2) Node Generating Portions 130A1, 130A2, 130B1, 130B2

The node generating portion 130A1 according to the present embodiment is disposed so as to face the upper, short side of the upper electrode E1a.

The node generating portion 130A1 is connected to the connecting arm 111A1 on the center line CX in the X-axis direction. At the same time, the node generating portion 130A1 is connected to the retaining arm 113A1 in such a manner that the line segment $C_1$ coincides with the center of the retaining arm 113A1 in the width direction thereof. The other configurations of the node generating portion 130A1 are the same as those of the node generating portion 130A according to the first embodiment.

It is noted that the configuration of the node generating portions 130A2, 130B1, and 130B2 is the same as the configuration of the node generating portions 130A1 and will not be repeated herein.

(6-3) Connecting Arms 111A1, 111A2, 111B1, 111B2

The configuration of the connecting arms 111A1, 111A2, 111B1, and 111B2 according to the present embodiment is the same as the configuration of the connecting arms 111A1, 111A2, 111B1, and 111B2 according to the fourth embodiment.

(6-4) Retaining Arms 112A1, 112A2, 112B1, 112B2

The configuration of the retaining arms 112A1, 112A2, 112B1, and 112B2 according to the present embodiment is the same as the configuration of the retaining arms 112A1, 112A2, 112B1, and 112B2 according to the fourth embodiment.

Seventh Embodiment

Figure 14:
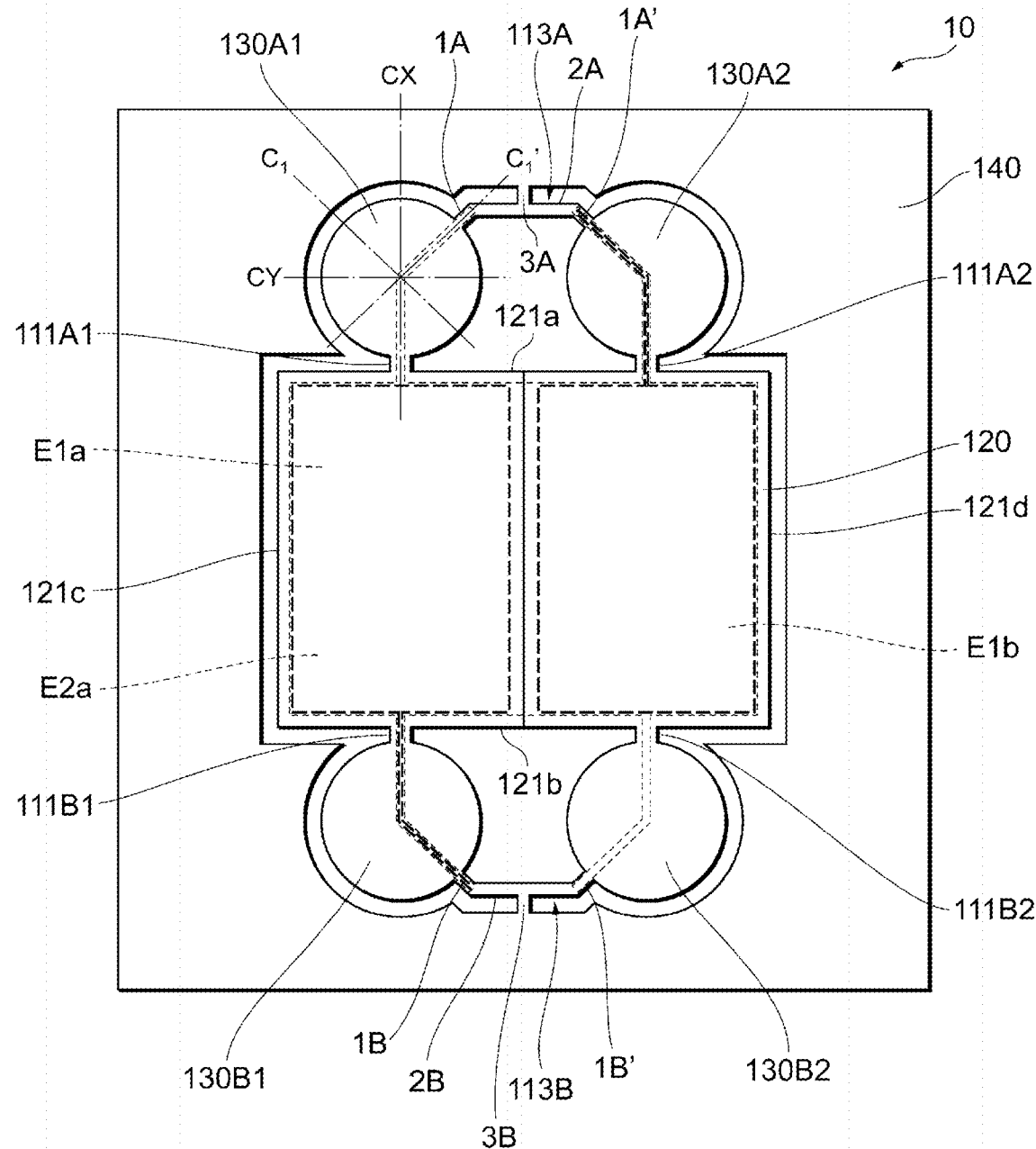
FIG. 14 is a plan view corresponding to FIG. 4 and illustrating a resonator according to a seventh exemplary embodiment with the upper cover removed.

FIG. 14 is an exemplary plan view of the resonator 10 according to the present embodiment. Of details of the configuration of the resonance device 1 according to the present embodiment, differences from the first embodiment will be mainly described.

In the present embodiment, as components corresponding to the node generating portions 130A and 130B, the connecting arms 111A and 111B, and the retaining arms 112A and 112B of the first embodiment, the resonator 10 includes the node generating portions 130A1, 130A2, 130B1, and 130B2, the connecting arms 111A1, 111A2, 111B1, and 111B2, and the retaining arms 113A and 113B. In the present embodiment, the resonator 10 does not include components corresponding to the retaining arms 112A and 112B of the first embodiment.

(7-1) Vibrating Portion 120

The configuration of the vibrating portion 120 according to the present embodiment is the same as the configuration of the vibrating portion 120 according to the fourth embodiment.

(7-2) Node Generating Portions 130A1, 130A2, 130B1, 130B2

The configuration of the node generating portions 130A1, 130A2, 130B1, and 130B2 according to the present embodiment is the same as the configuration of the node generating portions 130A1, 130A2, 130B1, 130B2 according to the fifth embodiment.

(7-3) Connecting Arms 111A1, 111A2, 111B1, 111B2

The configuration of the connecting arms 111A1, 111A2, 111B1, and 111B2 according to the present embodiment is the same as the configuration of the connecting arms 111A1, 111A2, 111B1, and 111B2 according to the fourth embodiment.

(7-4) Retaining Arms 113A, 113B

In the present embodiment, the retaining arm 113A includes four arms 1A, 1A', 2A, and 3A. In the space between the vibrating portion 120 and the retainer 140, the arm 2A is disposed parallel to the X-axis direction in such a manner as to face the short side 121a of the vibrating portion 120.

The arm 3A is disposed parallel to the Y-axis direction. The arm 3A connects at one end thereof to a center portion of the arm 2A in the X-axis direction, extends therefrom substantially perpendicularly toward the retainer 140, and connects at the other end thereof to the retainer 140.

The arm 1A is disposed along an extension of the line segment $C_1'$. The arm 1A connects at one end thereof to the node generating portion 130A1 in such a manner that the center of the width thereof coincides with the line segment $C_1'$. The other end of the arm 1A connects to one end of the arm 2A. The configuration of the arm 1A' is the same as the configuration of the arm 1A.

The other configurations and functions are the same as those of the first embodiment.

The exemplary embodiments described above are for ease of understanding of the present invention, not for interpreting the present invention in a limiting manner. The present invention may be changed or modified without departing from the spirit thereof, and the present invention includes equivalents thereof. That is, the embodiments to which design changes are appropriately made by those skilled in the art are also included in the scope of the present invention, as long as they have the features of the present invention. For example, elements of the embodiments and their arrangements, materials, conditions, shapes, and sizes are not limited to illustrated ones and may be changed as appropriate.

The exemplary embodiments described above are examples, and partial replacement or combination of configurations described in different embodiments can of course be made. These modified embodiments are also included in the scope of the present invention as long as they have the features of the present invention.

REFERENCE SIGNS LIST

1: resonance device
10: resonator
30: upper cover
20: lower cover
140: retainer
111A, 111B: connecting arm
112A, 112B: retaining arm
113A, 113B: retaining arm
130A, 130B: node generating portion
120: vibrating portion
F1: $SiO_2$ film
F2: Si layer
F3: piezoelectric thin film
E1, E2: metal layer

The invention claimed is:

1. A resonator comprising:
a piezoelectric vibrator;
a retainer surrounding at least a portion of the piezoelectric vibrator;
a first node generator disposed between the piezoelectric vibrator and the retainer;
a first connecting arm that connects the first node generator to a region in the piezoelectric vibrator that faces the first node generator; and
a first retaining arm that connects the first node generator to a region in the retainer that faces the first node generator, with the first retaining arm extending in a direction away from a center of the first node generator and away from the piezoelectric vibrator, wherein the first node generator is symmetrical with respect to each of two lines passing through a center of the first node generator along first and second directions orthogonal to each other, with the first direction being a direction in which the first connecting arm connects the first node generator to the piezoelectric vibrator.

2. The resonator according to claim 1, further comprising:
a second node generator disposed between the piezoelectric vibrator and the retainer and opposite the first node generator, such that the piezoelectric vibrator is interposed between the first and second node generators;
a second connecting arm that connects the piezoelectric vibrator to the second node generator; and
a second retaining arm that connects the second node generator to the retainer, with the second retaining arm extending in a direction away from a center of the second node generator and away from the piezoelectric vibrator,
wherein the second node generator is symmetrical with respect to each of two lines passing through a center of the second node generator along the first direction and the second direction.

3. The resonator according to claim 2, wherein the piezoelectric vibrator comprises a plurality of stacked layers including a first electrode, a piezoelectric thin film, and a second electrode.

4. The resonator according to claim 3, wherein:
the first and second node generators each have a plurality of node regions where vibrational displacement of the piezoelectric vibrator in a stacking direction of the stacked layers is smaller than in areas around the first and second node generators,
the first retaining arm connects to the first node generator at any of the plurality of node regions in the first node generator, and
the second retaining arm connects to the second node generator at any of the plurality of node regions in the second node generator.

5. The resonator according to claim 4, wherein the resonator includes a plurality of first retaining arms and a plurality of second retaining arms that each connect to respective node regions of the plurality of node regions.

6. The resonator according to claim 2, wherein the first and second node generators are substantially circular in shape.

7. The resonator according to claim 2, wherein the first and second node generators are rectangular shaped with four sides of substantially equal length.

8. The resonator according to claim 2, wherein the first and second connecting arms each have a width that is larger than a width of the first and second retaining arms.

9. The resonator according to claim 2, wherein the first retaining arm does not lie on an extension of the first connecting arm along the first direction and the second retaining arm does not lie on an extension of the second connecting arm along the first direction.

10. A resonance device comprising the resonator according to claim 1, and a lower cover and an upper cover configured to sandwich the resonator in a space therebetween.

11. A resonator device comprising:
a piezoelectric vibrator;
a first vibrational node disposed between a first side of the piezoelectric vibrator and a retainer;
a first connecting arm that connects the first vibrational node to the first side of the piezoelectric vibrator; and
a first retaining arm that connects the first vibrational node to the retainer, with the first retaining arm extending in a direction away from a center of the first vibrational node and away from the piezoelectric vibrator,
wherein the first vibrational node comprises a symmetrical shape relative to a first line extending in an orthogonal direction from a midpoint of the first side of the piezoelectric vibrator and a second line extending in a direction parallel to the first side of the piezoelectric vibrator.

12. The resonator device according to claim 11, wherein the first vibrational node comprises a substantially circular shape.

13. The resonator device according to claim 12, wherein the first vibrational node comprises a diameter greater than a width of the first connecting arm.

14. The resonator device according to claim 11, wherein the first retaining arm comprises a pair of retaining arms connecting the first vibrational node to the retainer, with the pair of retaining arms symmetrically disposed at angles relative to the first line that extends orthogonally from the midpoint of the first side of the piezoelectric vibrator.

15. The resonator device according to claim 11, further comprising:
a second vibrational node disposed between a second side of the piezoelectric vibrator and the retainer, such that the piezoelectric vibrator is interposed between the first and second vibrational nodes;
a second connecting arm that connects the second of the piezoelectric vibrator to the second vibrational node; and
a second retaining arm that connects the second vibrational node to the retainer, with the second retaining arm extending in a direction away from a center of the second vibrational node and away from the piezoelectric vibrator,
wherein the second vibrational node is symmetrically disposed about the piezoelectric vibrator relative to the first vibrational node.

16. The resonator device according to claim 15, wherein the piezoelectric vibrator comprises a plurality of stacked layers including a first electrode, a piezoelectric thin film, and a second electrode.

17. The resonator device according to claim 15, wherein the first retaining arm does not lie on an extension of the first connecting arm along the direction of the first line and the second retaining arm does not lie on an extension of the second connecting arm along the direction of the first line.

18. The resonator device according to claim 15, wherein the first and second connecting arms each have a width that is larger than a width of the first and second retaining arms.

19. The resonator device according to claim 15, wherein:
the first and second vibrational nodes each have a plurality of node regions where vibrational displacement of the piezoelectric vibrator in a thickness direction is smaller than in areas around the first and second vibrational nodes,
the first retaining arm connects to the first vibrational node at any of the plurality of node regions in the first vibrational node, and
the second retaining arm connects to the second vibrational node at any of the plurality of node regions in the second vibrational node.

20. A resonance device according to claim 11, further comprising upper and lower covers defining a cavity with the piezoelectric vibrator disposed therein.

* * * * *